United States Patent
Cho et al.

(10) Patent No.: US 10,998,247 B2
(45) Date of Patent: May 4, 2021

(54) BOARD WITH EMBEDDED PASSIVE COMPONENT

(71) Applicant: SAMSUNG ELECTRONICS CO., LTD., Suwon-si (KR)

(72) Inventors: Jung Hyun Cho, Suwon-si (KR); Young Sik Hur, Suwon-si (KR); Won Wook So, Suwon-si (KR); Kyung Hwan Ko, Suwon-si (KR); Yong Ho Baek, Suwon-si (KR); Yong Duk Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/523,498

(22) Filed: Jul. 26, 2019

(65) Prior Publication Data

US 2020/0058569 A1 Feb. 20, 2020

(30) Foreign Application Priority Data

Aug. 16, 2018 (KR) .................. 10-2018-0095496
Oct. 4, 2018 (KR) .................. 10-2018-0118461

(51) Int. Cl.
*H05K 1/18* (2006.01)
*H01L 23/31* (2006.01)
(Continued)

(52) U.S. Cl.
CPC ........ *H01L 23/3114* (2013.01); *H05K 1/0298* (2013.01); *H05K 1/115* (2013.01); *H05K 1/181* (2013.01)

(58) Field of Classification Search
USPC ........................................ 361/761
See application file for complete search history.

(56) References Cited

U.S. PATENT DOCUMENTS 6,724,638 B1 4/2004 Inagaki et al.
9,743,526 B1 8/2017 Blackshear et al.
(Continued)

FOREIGN PATENT DOCUMENTS

JP 2013-110329 A 6/2013
JP 5639242 B2 12/2014
(Continued)

OTHER PUBLICATIONS

Communication from KIPO, dated Jan. 29, 2020, in Korean Application No. 10-2018-0118461.
(Continued)

*Primary Examiner* — Andargie M Aychillhum
(74) *Attorney, Agent, or Firm* — Sughrue Mion, PLLC

(57) ABSTRACT

A board includes: a core structure; one or more first passive components embedded in the core structure; a first build-up structure disposed on one side of the core structure and including first build-up layers and first wiring layers; and a second build-up structure disposed on the other side of the core structure and including second build-up layers and second wiring layers. One surface of a first core layer contacting a first insulating layer is coplanar with one surface of each of the one or more first passive components contacting a first insulating layer, the other surface of each of the one or more first passive components covered with a second insulating layer is spaced apart from a second core layer, and the one or more first passive components are electrically connected to at least one of the plurality of first wiring layers and the plurality of second wiring layers.

19 Claims, 15 Drawing Sheets

(51) Int. Cl.
H05K 1/11 (2006.01)
H05K 1/02 (2006.01)

(56) References Cited

U.S. PATENT DOCUMENTS

| | | |
|---|---|---|
| 2014/0284780 A1 | 9/2014 | Kinoshita |
| 2014/0307402 A1 | 10/2014 | Sugiyama et al. |
| 2015/0062848 A1 | 3/2015 | Lee et al. |
| 2017/0256497 A1* | 9/2017 | Mano .................... H05K 1/183 |
| 2018/0114747 A1* | 4/2018 | Delacruz ............. H01L 21/4857 |

FOREIGN PATENT DOCUMENTS

| | | |
|---|---|---|
| JP | 2017-157792 A | 9/2017 |
| KR | 10-1084526 B1 | 11/2011 |
| KR | 10-2012-0127033 A | 11/2012 |
| KR | 10-2014-0117285 A | 10/2014 |
| KR | 10-1514539 B1 | 4/2015 |

OTHER PUBLICATIONS

Communication dated Jul. 23, 2020 issued by the Korean Intellectual Property Office in counterpart Korean Application No. 10-2018-0118461.

* cited by examiner

BOARD WITH EMBEDDED PASSIVE COMPONENT

CROSS-REFERENCE TO RELATED APPLICATION(S)

This application claims benefit of priority to Korean Patent Application Nos. 10-2018-0118461 filed on Oct. 4, 2018 and 10-2018-0095496 fled on Aug. 16, 2018 in the Korean Intellectual Property Office, the disclosures of which are incorporated herein by references in its entirety.

TECHNICAL FIELD

The present disclosure relates to a board with an embedded passive element, and more particularly, to a board with an embedded passive element, on which a semiconductor package may be mounted.

BACKGROUND

Recently, there has been a demand for a high-performance package in order to process data, amounts of which have increased exponentially, and, in addition to such a change, improvements in a performance of a board and passive elements in a package have also been demanded. For example, a capacitor as the passive component is required to have excellent high-temperature reliability, a small size, high capacitance, and a low equivalent series inductance (ESL) value. The ESL value is in close relation to noise and power consumption and a reduction of the ESL value may improve performance of the capacitor. Furthermore, an ESL reduction effect may be significantly increased by decreasing a distance between the capacitor and a semiconductor.

In a high-performance package according to the related art, a capacitor is disposed around a semiconductor (DSC: die side capacitor) or is disposed adjacent to a solder ball of a board below a semiconductor region (LSC: land side capacitor), thereby decreasing a distance between the capacitor and the semiconductor. However, the distance is several to several tens of millimeters and accordingly parasitic inductance may be caused, adversely affecting power noise and power integrity.

SUMMARY

An aspect of the present disclosure may provide a board having an embedded passive component, which may improve power integrity by significantly decreasing a distance between a semiconductor chip and a passive component to reduce parasitic inductance and impedance of the board, may improve reliability by significantly reducing defects such as a void or undulation, and, particularly, may have excellent quality in via processing and plating even in a case in which thicknesses of passive components are different from each other when a plurality of passive components are embedded.

According to an aspect of the present disclosure, a board includes: a core structure including a first insulating layer, a first core layer disposed on the first insulating layer and including a first through-hole, one or more first passive components disposed in the first through-hole, a second insulating layer covering the one or more first passive components and filling at least a portion of the first through-hole, a second core layer disposed on the second insulating layer, and a third insulating layer disposed on the second core layer; a first build-up structure disposed on one side of the core structure and including a plurality of first build-up layers and a plurality of first wiring layers; and a second build-up structure disposed on the other side of the core structure and including a plurality of second build-up layers and a plurality of second wiring layers. One surface of the first core layer contacting the first insulating layer is coplanar with one surfaces of the one or more first passive components contacting the first insulating layer, the other surfaces of the one or more first passive components covered with the second insulating layer is spaced apart from the second core layer, and the one or more first passive components are electrically connected to at least one of the plurality of first wiring layers and the plurality of second wiring layers.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Electronic Device

Figure 1:
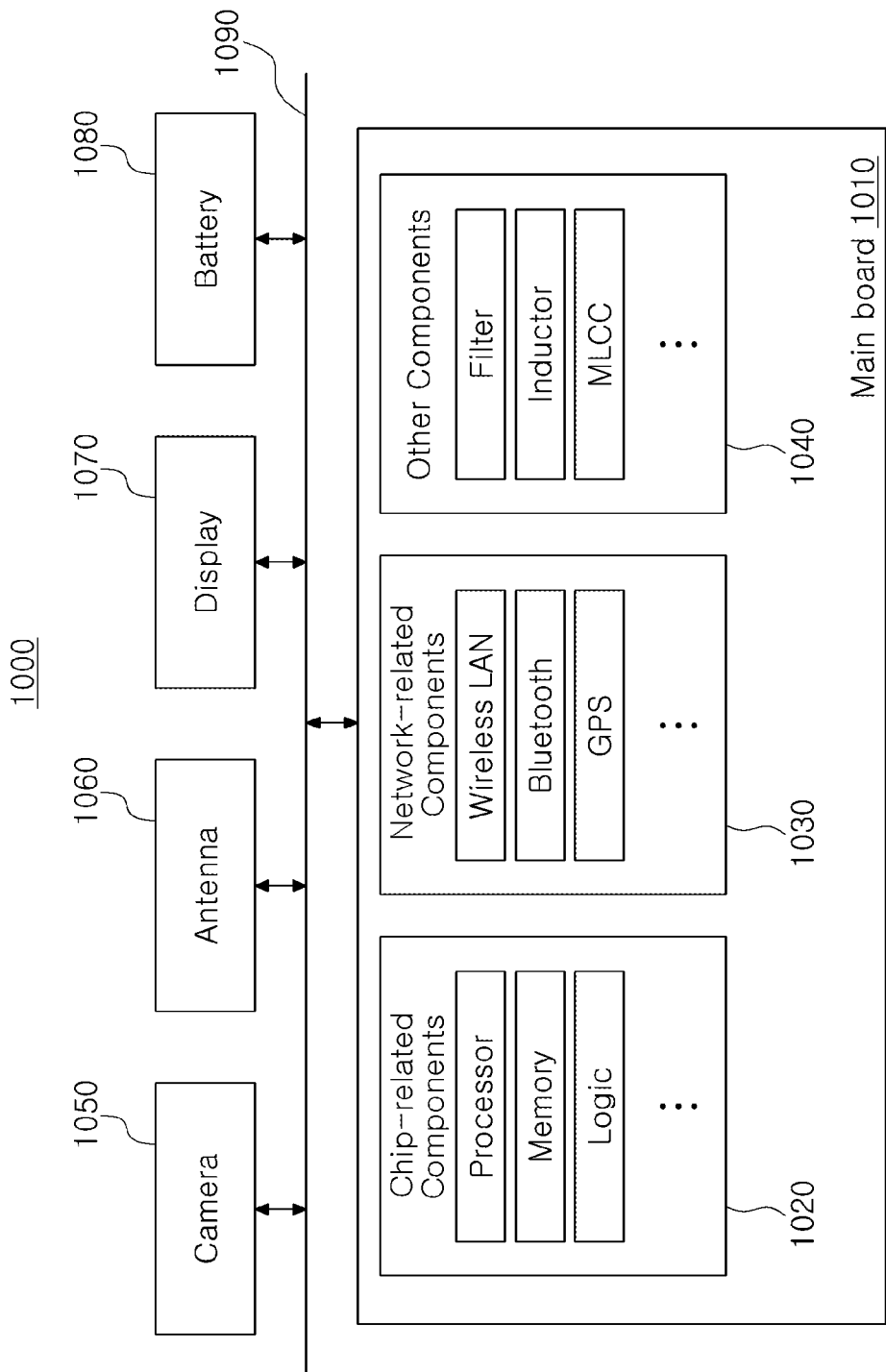
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
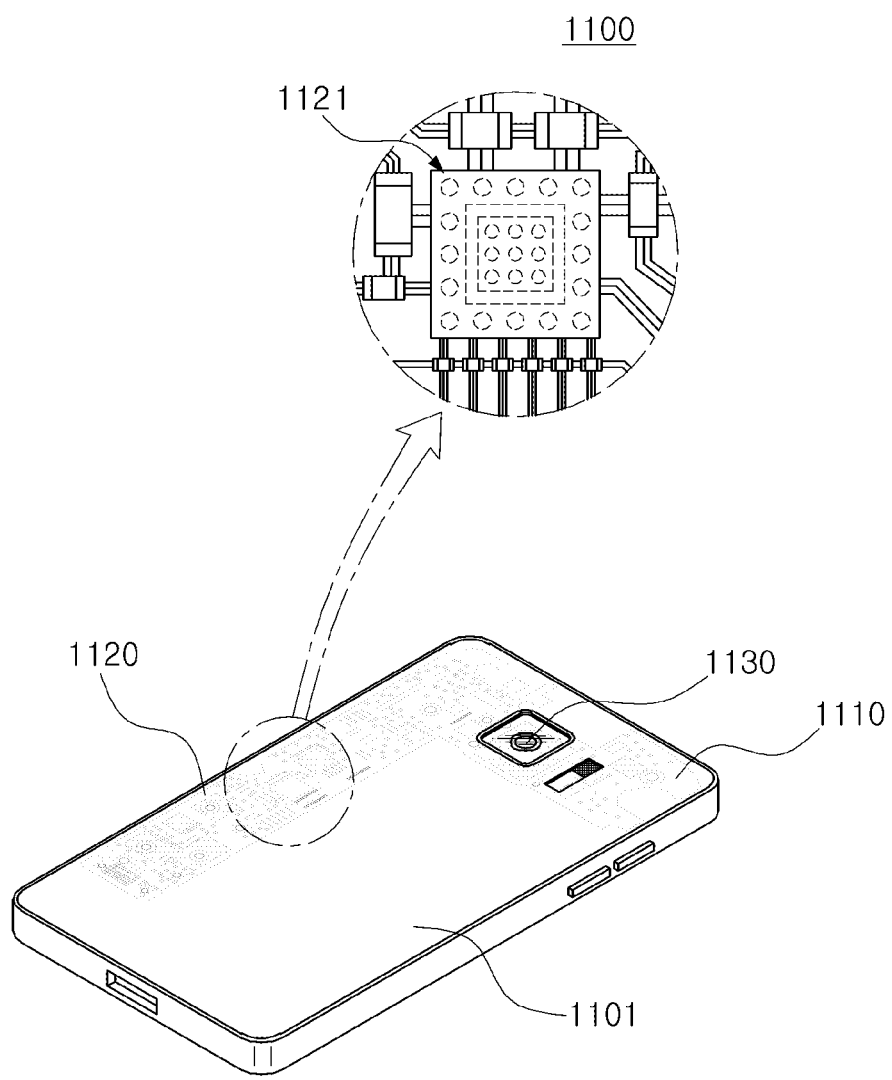
FIG. 2 is a schematic perspective view illustrating an example of an electronic device.

FIG. 2 is a schematic perspective view illustrating an example of an electronic device.

Referring to FIG. 2, an electronic device may be a smartphone 1100. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera 1130, may be accommodated in the body 1101. Some of the electronic components 1120 may be chip related components, and some of the chip related components may be a semiconductor package 1121. The semiconductor package 1121 may include an organic interposer. Further, although not illustrated, the semiconductor package 1121 may be mounted on a printed circuit board such as a ball grid array (BGA) board in order to be mounted on a mainboard or the like. Meanwhile, the electronic device is not necessarily limited to the smartphone 1100, but may be other electronic devices.

Board with Embedded Passive Component

Hereinafter, a board with an embedded passive component, which may improve power integrity by significantly decreasing a distance between a semiconductor chip and a passive component to reduce parasitic inductance and impedance of the board, may improve reliability by significantly reducing defects such as a void or undulation, and, particularly, may have excellent quality in via processing and plating even in a case in which thicknesses of passive components are different from each other when a plurality of passive components are embedded, will be described with reference to the accompanying drawings.

Figure 3:
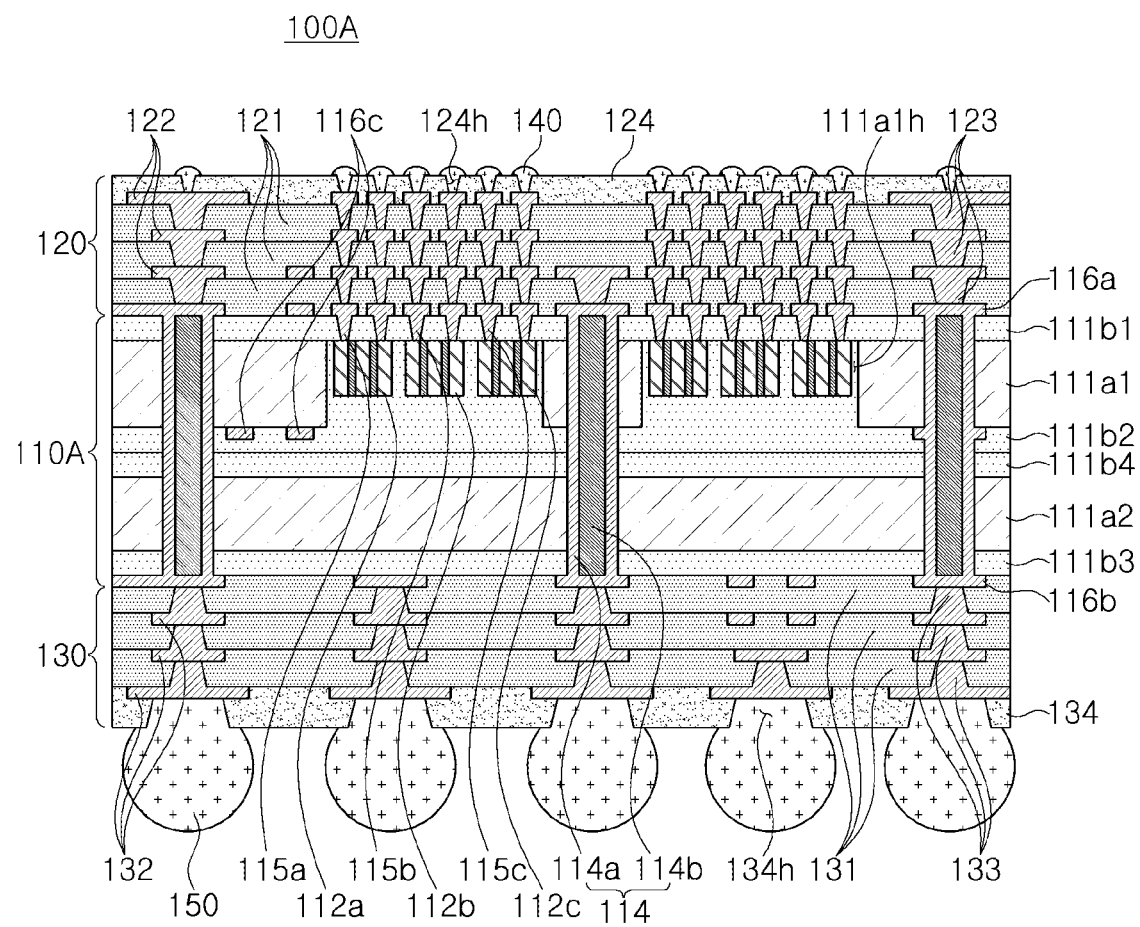
FIG. 3 is a schematic cross-sectional view illustrating an example of a board with an embedded passive component.

FIG. 3 is a schematic cross-sectional view illustrating an example of a board with an embedded passive component.

Referring to FIG. 3, a board 100A with an embedded passive component according to an example may include a core structure 110A and first and second build-up structures 120 and 130 disposed on opposite sides of the core structure 110A. The core structure 110A may include a plurality of core layers 111a1 and 111a2, and a plurality of insulating layers 111b1, 111b2, 111b3, and 111b4. More specifically, the core structure 110A may include a first insulating layer 111b1, a first core layer 111a1 disposed on the first insulating layer 111b1 and having one or more through-holes 111a1h, one or more passive components 112a, 112b, and 112c disposed in each of the one or more through-holes 111a1h, respectively, a second insulating layer 111b2 covering the passive components 112a, 112b, and 112c and filling at least a portion of each of the through-holes 111a1h, a second core layer 111a2 disposed over the second insulating layer 111b2, a third insulating layer 111b3 disposed on the second core layer 111a2, and a fourth insulating layer 111b4 disposed between the second insulating layer 111b2 and the second core layer 111a2. Further, the core structure 110A may include a first core wiring layer 116a disposed on the opposite side of the first insulating layer 111b1 from the first core layer 111a1, and a second core wiring layer 116b disposed on the opposite side of the third insulating layer 111b3 from the second core layer 111a2. The first and second core wiring layers 116a and 116b may be electrically connected to each other through through-vias 114 penetrating through all of the first and second core layers 111a1 and 111a2, and the first to fourth insulating layers 111b1, 111b2, 111b3, and 111b4. The passive components 112a, 112b, and 112c may be electrically connected to the first core wiring layer 116a through connection vias 115a, 115b, and 115c penetrating through the first insulating layer 111b1, respectively. The first build-up structure 120 may include a plurality of first build-up layers 121, a plurality of first wiring layers 122, and a plurality of first wiring via layers 123, and the second building structure 130 may include a plurality of second build-up layers 131, a plurality of second wiring layers 132, and a plurality of second wiring via layers 133. The respective passive components 112a, 112b, and 112c are electrically connected to the plurality of first wiring layers 122 of the first build-up structure 120 or the plurality of second wiring layers 132 of the second build-up structure 130 through the first core wiring layer 116a or the second core wiring layer 116b.

In the high-performance package according to the related art, a capacitor is disposed around a semiconductor on a board (DSC), or disposed adjacent to a solder ball of the board below a semiconductor region (LSC) to decrease an electrical distance. However, the distance is several to several tens of millimeters and accordingly parasitic inductance is caused, which makes it difficult to achieve an excellent effect in terms of power noise and power integrity. In order to solve such a problem, a passive component such as a capacitor may be embedded in a board below a semiconductor region. For example, the passive component may be embedded in a core layer of the board. In detail, a cavity may be formed in the core layer, and the passive component may be disposed in the cavity and then covered with an insulating material. In this case, however, a small-sized passive component is disposed adjacent to one side surface of the thick core layer, and thus it is difficult to fill the remaining space in the cavity with the insulating material, such that defects such as a void or undulation may easily occur. Alternatively, the passive component may be embedded in a build-up layer of the board. In this case, however, the build-up layer is thinner than the passive component to be embedded, and even in a case in which the build-up layers are stacked in multiple layers, it is difficult to manage a depth of a cavity for embedment due to an accumulated tolerance of a thickness of the stacked build-up layers.

On the other hand, in the board 100A with an embedded passive component according to an example, the core structure 110A includes the plurality of core layers 111a1 and 111a2, and the plurality of insulating layers 111b1, 111b2, 111b3, and 111b4. The through-holes 111a1h are formed in at least one core layer 111a, and the passive components 112a, 112b, and 122c are disposed in the through-hole 111a1h and embedded by being covered with the insulating material. That is, the core structure 110A is formed by forming the through-hole 111a1h in one core layer 111a1 having a thickness similar to that of each of the passive components 112a, 112b, and 112c (for example, a difference between the thickness of the core layer 111a and the thickness of each of the passive components 112a, 112b, and 112c is several to several tens of micrometers), disposing the passive components 112a, 112b, and 112c in the through-hole 111a1h, and then additionally stacking a core layers 111a2 and the insulating layers 111b1, 111b2, 111b3, and 111b4 in an alternative manner to increase a thickness of the core structure 110A. Accordingly, the small-sized passive components 112a, 112b, and 112c are disposed in the through-hole 111a1h formed in the core layer 111a having the similar thickness and are covered with the insulating material, such that the above-described defects such as a void or undulation may be resolved. In addition, the core structure 110 which is thick and is formed to be symmetrical as far as possible is formed by additionally using other core layers 111a2, and the insulating layers 111b1, 111b2, 111b3, and 111b4, and thus an excellent effect in terms of maintaining rigidity and suppressing warpage, which is similar to that of the relate art in which one thick core layer is used, may be achieved.

Particularly, in the board 100A with an embedded passive component according to an example, one surface of the first core layer 111a1 contacting the first insulating layer 111b1, and one surface of each of the passive components 112a, 112b, and 112c are coplanar with each other, for example, one surface of an electrode of each of the passive components 112a, 112b, and 112c contacting the first insulating layer, and one surface of the second insulating layer 111b2 contacting the first insulating layer 111b1 are coplanar with each other, and at the same time, the other surface of each of the passive components 112a, 112b, and 112c covered with the second insulating layer 111b2 is spaced apart from the second core layer 111a2 by a predetermined distance. As can be appreciated from the process to be described below, in a process of manufacturing the core structure 110A, the passive components 112a, 112b, and 112c may be disposed so that one surface of each of the passive components 112a, 112b, and 112c and the first core layer 111a1 in which the passive components 112a, 112b, and 112c are embedded are coplanar with each other, and then the first core layer 111a1 in which the passive components 112a, 112b, and 112c are embedded may be turned upside down so that a flat surface faces upward. In this case, a flat surface in which the one surface of each of the passive components 112a, 112b, and 112c and the first core layer 111a1 are coplanar with each other may be provided regardless of a thickness of each of the passive components 112a, 112b, and 112c, and an insulation distance to the electrode of each of the passive components 112a, 112b, and 112c may be uniform. Therefore, heights of the connection vias 115a, 115b, and 115c respectively connected to the passive components 112a, 112b, and 112c may be the same as one another. In this case, in a process of forming the first insulating layer 111b1, the connection vias 115a, 115b, and 115c, and the first core wiring layer 116a, more excellent quality in via processing and plating may be realized without defects such as a void or undulation.

Hereinafter, a configuration of the board 100A with an embedded passive component will be described in more detail with reference to the accompanying drawings.

The passive components 112a, 112b, and 112c are embedded in the core structure 110A, and the core structure 110A serves to add rigidity to the board. The core structure 110A may include a first insulating layer 111b1, a first core layer 111a1 disposed on the first insulating layer 111b1 and having one or more through-holes 111a1h, one or more passive components 112a, 112b, and 112c disposed in the one or more through-holes 111a1h, respectively, a second insulating layer 111b2 covering the passive components 112a, 112b, and 112c and filling at least a portion of each of the through-holes 111a1h, a second core layer 111a2 disposed over the second insulating layer 111b2, a third insulating layer 111b3 disposed on the second core layer 111a2, and a fourth insulating layer 111b4 disposed between the second insulating layer 111b2 and the second core layer 111a2. Further, the core structure 110A may include a first core wiring layer 116a disposed on the opposite side of the first insulating layer 111b1 from the first core layer 111a1, and a second core wiring layer 116b disposed on the opposite side of the third insulating layer 111b3 from the second core layer 111a2. The first and second core wiring layers 116a and 116b may be electrically connected to each other through through-vias 114 penetrating through all of the first and second core layers 111a1 and 111a2, and the first to fourth insulating layers 111*b*1, 111*b*2, 111*b*3, and 111*b*4. The passive components 112*a*, 112*b*, and 112*c* may be electrically connected to the first core wiring layer 116*a* through connection vias 115*a*, 115*b*, and 115*c* penetrating through the first insulating layer 111*b*1, respectively.

The first and second core layers 111*a*1 and 111*a*2 may each add rigidity to the core structure 110A. A material of each of the first and second core layers 111*a*1 and 111*a*2 may be an insulating material. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, a copper clad laminate (CCL) or an unclad CCL. However, the material of the first and second core layers 111*a*1 and 111*a*2 is not limited thereto, and at least one of the first and second core layers 111*a*1 and 111*a*2 may also be formed of a different kind of rigid material such as a glass substrate or a ceramic substrate. The through-holes 111*a*1*h* formed in the first core layer 111*a*1 may each be a hole formed to continuously surround the passive components 112*a*, 112*b*, and 112*c* accommodated in each through-hole 111*a*1*h* when viewed in a plan view.

The first to fourth insulating layers 111*b*1, 111*b*2, 111*b*3, and 111*b*4 may function as bonding layers which bond layers to each other in the core structure 110A. A material of each of the first to fourth insulating layers 111*b*1, 111*b*2, 111*b*3, and 111*b*4 may also be an insulating material. In this case, similarly, a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber, or the like, for example, prepreg (PPG) or the like, may be used as the insulating material. The first to fourth insulating layers 111*b*1, 111*b*2, 111*b*3, and 111*b*4 may be introduced and bonded in an uncured state, and then cured in a lump in order to suppress warpage. A boundary between the first to fourth insulating layers 111*b*1, 111*b*2, 111*b*3, and 111*b*4 may be apparent or may not be apparent. The fourth insulating layer 111*b*4 may be omitted, if necessary.

The first and second core layers 111*a*1 and 111*a*2 may have substantially the same thickness. The first and third insulating layers 113*a* and 113*c* may have substantially the same thickness. The thickness of each of the first and second core layers 111*a*1 and 111*a*2 may be greater than a thickness of each of the first to fourth insulating layers 111*b*1, 111*b*2, 111*b*3, and 111*b*4. Here, the thickness of the second insulating layer 111*b*2 does not include a thickness of a portion of the second insulating layer 111*b*2 filling the through-hole 111*a*1*h*. That is, the thickness of the second insulating layer 111*b*2 means a thickness of a portion of the second insulating layer 111*b*2 between the first core layer 111*a*1 and the fourth insulating layer 111*b*4. The core structure 110A is formed to be symmetrical with reference to a center thereof, for example, an interface of the second insulating layer 112*b*2 and the fourth insulating layer 112*b*4 as described above, and thus warpage may be effectively suppressed.

The number of passive components 112*a*, 112*b*, and 112*c* may be plural, and the plurality of passive components 112*a*, 112*b*, and 112*c* may be disposed in each through-hole 111*a*1*h*. The passive components 112*a*, 112*b*, and 112*c* may be the same as or different from each other. The passive components 112*a*, 112*b*, and 112*c* may be the known passive components such as capacitors, inductors, or the like. Thicknesses of the passive components 112*a*, 112*b*, and 112*c* may be the same as or different from each other. One surfaces of the passive components 112*a*, 112*b*, and 112*c* contacting the first insulating layer 111*b*1 may be coplanar with each other, and the other surfaces of the passive components 112*a*, 112*b*, and 112*c* covered with the second insulating layer 111*b*2 may be physically spaced apart from the second core layer 111*a*2 by a predetermined distance. Electrodes of the passive components 112*a*, 112*b*, and 112*c* may be electrically connected to the first core wiring layer 116*a* through the connection vias 115*a*, 115*b*, and 115*c*, respectively. The heights of the connection vias 115*a*, 115*b*, and 115*c* may be the same as one another. The thickness of each of the passive component 112*a*, 112*b*, and 112*c* may be smaller than a thickness of the first core layer 111*a*1. That is, the thickness of the first core layer 111*a*1 may be greater than the thickness of each of the passive components 112*a*, 112*b*, and 112*c*, and a difference between the thickness of the first core layer 111*a*1 and the thickness of each of the passive components 112*a*, 112*b*, and 112*c* may be several to several tens of micrometers or less.

The first and second core wiring layers 116*a* and 116*b* may perform various functions in the core structure 110A depending on designs of the corresponding layers. For example, the first and second core wiring layers 116*a* and 116*b* may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first and second core wiring layers 116*a* and 116*b* may include various pads. A material of each of the first and second core wiring layers 116*a* and 116*b* may be a conductive material such as copper (Cu), aluminum (Al), silver (Ag), tin (Sn), gold (Au), nickel (Ni), lead (Pb), titanium (Ti), or alloys thereof, specifically, a metal material.

Mark patterns 116*c* may be disposed on the other surface of the first core layer 111*a*1 covered with the second insulating layer 111*b*2. The mark pattern 116*c* may be an align mark for disposing the passive components 112*a*, 112*b*, and 112*c* in the through-hole 111*a*1*h*. At least one of the mark patterns 116*c* may be electrically insulated from the plurality of first and second wiring layers 122 and 132. For example, at least one of the mark patterns 116*c* may be a discrete pattern and electrically floating with respect to the other conductive patterns, wiring layer, or vias of the board 100A with an embedded passive component. A material of the mark pattern 116*c* may be a conductive material such as copper (Cu), aluminum (Al), silver (Ag), tin (Sn), gold (Au), nickel (Ni), lead (Pb), titanium (Ti), or alloys thereof, specifically, a metal material.

The through-via 114 electrically connects the first and second core wiring layers 116*a* and 116*b* to each other. The through-via 114 may include a via for a ground, a via for power, a via for a signal, and the like. A material of each of the through-vias 114 may be a conductive material such as copper (Cu), aluminum (Al), silver (Ag), tin (Sn), gold (Au), nickel (Ni), lead (Pb), titanium (Ti), or alloys thereof, specifically, a metal material. The through-via 114 may have a cylindrical shape. The through-via 114 may penetrate through the core structure 110A. This is because the core wiring layer in the core structure 110A may be omitted. That is, the core wiring layer in the core structure 110A may be omitted, and the number of other pattern layers may also be minimized. This is to significantly reduce generation of a gap between layers caused when metal inhibits movement of absorbed moisture. Here, the minimized number of pattern layers may include the mark pattern 116c described above such as an equipment-targeted design for processing the through-hole 111a1h and embedding the passive components 112a, 112b, and 112c. The through-via 114 may be a plated through-hole (PHT) in which a metal material 114a is plated in a conformal manner along a wall surface of a through-via hole penetrating through all of the first and second core layers 111a1 and 111a2, and the first to fourth insulating layers 111b1, 111b2, 111b3, and 111b4. In this case, a space surrounded by the metal material 114a in the through-via hole may be filled with a plugging material 114b. As the plugging material 114b, a known plugging material such as an insulating material or a conductive ink may be adopted.

The connection vias 115a, 115b, and 115c may electrically connect the passive components 112a, 112b, and 112c to the first core wiring layer 116a, respectively. As such, the passive components 112a, 112b, and 112c may be electrically connected to the first core wiring layer 116a in the core structure 110A through the connection vias 115a, 115b, and 115c, respectively, only in an upward direction. The connection vias 115a, 115b, and 115c may each include one of a via for a ground, a via for power, a via for a signal, or the like. Further, a material of each of the connection vias 115a, 115b, and 115c may be a conductive material such as copper (Cu), aluminum (Al), silver (Ag), tin (Sn), gold (Au), nickel (Ni), lead (Pb), titanium (Ti), or alloys thereof, specifically, a metal material. Each of the connection vias 115a, 115b, and 115c may have a tapered shape of which a tapering direction is the same as that of a wiring via of the wiring via layer 123 of the first build-up structure 120.

The first build-up structure 120 provides various wiring designs so that the board 100A with an embedded passive component may substantially function as a printed circuit board. The first build-up structure 120 may include the plurality of first build-up layers 121, the plurality of first wiring layers 122, and the plurality of first wiring via layers 123. A first passivation layer 124 may be disposed on the uppermost side of the first build-up structure 120. The first passivation layer 124 may have a plurality of openings 124h exposing at least portions of the uppermost first wiring layer 122 and a first electrical connection structure 140 may be disposed in each of the plurality of openings 124h.

The first build-up layer 121 may include an insulating material, and a thermosetting resin such as an epoxy resin, a thermoplastic resin such as a polyimide resin, a resin in which the thermosetting resin or the thermoplastic resin is mixed with an inorganic filler, or is impregnated in a core material of the inorganic filler, for example, Ajinomoto build-up film (ABF), or the like, may be used as the insulating material, but the material of the first build-up layer 121 is not limited thereto. The number of first build-up layers 121 is not particularly limited, but may be variously designed depending on design particulars. A boundary between the first build-up layers 121 may not be apparent or may be apparent. A thickness of each of the first build-up layers 121 may be smaller than a thickness of each of the core layers 111a1 and 111a2. In addition, an elastic modulus of each of the first build-up layers 121 may be smaller than an elastic modulus of each of the core layers 111a1 and 111a2. That is, the first build-up layer 121 may be designed to be as thin as possible in order to introduce the plurality of first wiring layers 122.

The first wiring layer 122 may perform various functions depending on a design of the corresponding layer. For example, the first wiring layers 122 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first wiring layers 122 may include various pads. A material of each of the first wiring layers 122 may be a conductive material such as copper (Cu), aluminum (Al), silver (Ag), tin (Sn), gold (Au), nickel (Ni), lead (Pb), titanium (Ti), or alloys thereof, specifically, a metal material.

The first wiring via layer 123 electrically connects the first wiring layers 122 to each other. In addition, the first wiring via layer 123 electrically connects the first core wiring layer 116a and the first wiring layer 122 to each other. The first wiring via layers 123 may also each include a via for a ground, a via for power, a via for a signal, and the like. Further, a material of each of the first wiring via layers 123 may be a conductive material such as copper (Cu), aluminum (Al), silver (Ag), tin (Sn), gold (Au), nickel (Ni), lead (Pb), titanium (Ti), or alloys thereof, specifically, a metal material. A wiring via of each of the first wiring via layer 123 may have a tapered shape of which a tapering direction is the same as that of each of the connection vias 115a, 115b, and 115c.

The first passivation layer 124 may protect the first build-up layer 121, the first wiring layer 122, and the first wiring via layer 123. A material of the first passivation layer 124 is not particularly limited. For example, the material of the first passivation layer 124 may be an insulating material, and in this case, a solder resist may be used as the insulating material. However, the material of the first passivation layer 124 is not limited thereto, but may also be prepreg, ABF, or the like described above.

The first electrical connection structure 140 may be used as an external connection terminal for mounting a semiconductor chip, a semiconductor package, or the like on the board 100A with an embedded passive component. The first electrical connection structure 140 may be formed of a low melting point metal, for example, a solder such as tin (Sn)-aluminum (Al)-copper (Cu), or the like. However, this is only an example, and a material of the first electrical connection structure 140 is not particularly limited thereto. The first electrical connection structure 140 may be a land, a ball, a pin, or the like. The first electrical connection structure 140 may have a multilayer or single layer structure. When the first electrical connection structure 140 has a multilayer structure, the first electrical connection structure 140 may include a copper (Cu) pillar and a solder. When the first electrical connection structure 140 has a single layer structure, the first electrical connection structure 140 may include a tin-silver solder or copper (Cu). However, this is only an example, and the first electrical connection structure 140 is not limited thereto.

The second build-up structure 130 also provides various wiring designs so that the board 100A with an embedded passive component may substantially function as a printed circuit board. The second build-up structure 130 may include the plurality of second build-up layers 131, the plurality of second wiring layers 132, and the plurality of second wiring via layers 133. A second passivation layer 134 may be disposed on the lowermost side of the second build-up structure 130. The second passivation layer 134 may have a plurality of openings 134h each exposing at least portions of the lowermost second wiring layer 132. A second electrical connection structure 150 may be disposed in each of the plurality of openings 134h. The second build-up structure 130 may be formed to be symmetrical to the first build-up structure 120 with respect to the core structure 110A as far as possible. That is, the number of build-up layers 121 and the number of build-up layers 131 may be the same as each other, the number of wiring layers 122 and the number of wiring layers 132 may be the same as each other. Further, the thickness of each of the build-up layers 121 may be the same as the thickness of each of the build-up layers 131, and the thickness of each of the wiring layers 122 may be the same as the thickness of each of the wiring layers 132. In other words, the first and second build-up structures 120 and 130 may be formed simultaneously by a build-up process on both sides of the core structure 110A.

The second build-up layer 131 may include an insulating material, and a thermosetting resin such as an epoxy resin, a thermoplastic resin such as a polyimide resin, a resin in which the thermosetting resin or the thermoplastic resin is mixed with an inorganic filler, or is impregnated in a core material of the inorganic filler, for example, Ajinomoto build-up film (ABF), or the like, may be used as the insulating material, but the material of the second build-up layer 131 is not limited thereto. The number of second build-up layers 131 is not particularly limited, but may be variously designed depending on design particulars. A boundary between the second build-up layers 131 may not be apparent or may be apparent. A thickness of each of the second build-up layers 131 may be smaller than a thickness of each of the core layers 111a1 and 111a2. In addition, an elastic modulus of each of the second build-up layers 131 may be smaller than an elastic modulus of each of the core layers 111a1 and 111a2. That is, the second build-up layer 131 may be designed to be as thin as possible in order to introduce the plurality of second wiring layers 132.

The second wiring layer 132 may also perform various functions depending on a design of the corresponding layer. For example, the second wiring layers 132 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the second wiring layers 132 may include various pads. A material of each of the second wiring layers 132 may be a conductive material such as copper (Cu), aluminum (Al), silver (Ag), tin (Sn), gold (Au), nickel (Ni), lead (Pb), titanium (Ti), or alloys thereof, specifically, a metal material.

The second wiring via layer 133 electrically connects the respective second wiring layers 132 to each other. In addition, the second wiring via layer 133 electrically connects the second core wiring layer 116b and the second wiring layer 132 to each other. The second wiring via layers 133 may also each include a via for a ground, a via for power, a via for a signal, and the like. Further, a material of each of the second wiring via layers 133 may be a conductive material such as copper (Cu), aluminum (Al), silver (Ag), tin (Sn), gold (Au), nickel (Ni), lead (Pb), titanium (Ti), or alloys thereof, specifically, a metal material. A wiring via of each of the second wiring via layer 133 may have a tapered shape of which a tapering direction is opposite to that of a wiring via of each of the connection vias 115a, 115b, and 115c, and the first wiring via layer 123.

The second passivation layer 134 may protect the second build-up layer 131, the second wiring layer 132, and the second wiring via layer 133. A material of the second passivation layer 134 is also not particularly limited. For example, the material of the second passivation layer 134 may be an insulating material, and in this case, a solder resist may be used as the insulating material. However, the material of the second passivation layer 134 is not limited thereto, but may also be prepreg, ABF, or the like described above.

The second electrical connection structure 150 may be used as an external connection terminal for mounting the board 100A with an embedded passive component on a mainboard of an electronic device, or the like. The second electrical connection structure 150 may also be formed of a low melting point metal, for example, a solder such as tin (Sn)-aluminum (Al)-copper (Cu), or the like. However, this is only an example, and a material of the second electrical connection structure 150 is not particularly limited thereto. The second electrical connection structure 150 may be a land, a ball, a pin, or the like. The second electrical connection structure 150 may have a multilayer or single layer structure. When the second electrical connection structure 150 has a multilayer structure, the second electrical connection structure 150 may include a copper (Cu) pillar and a solder. When the second electrical connection structure 150 has a single layer structure, the second electrical connection structure 150 may include a tin-silver solder or copper (Cu). However, this is only an example, and the second electrical connection structure 150 is not limited thereto.

FIGS. 4 through 10 are schematic views illustrating an example of processes of manufacturing the board with an embedded passive component of FIG. 3.

Figure 4:
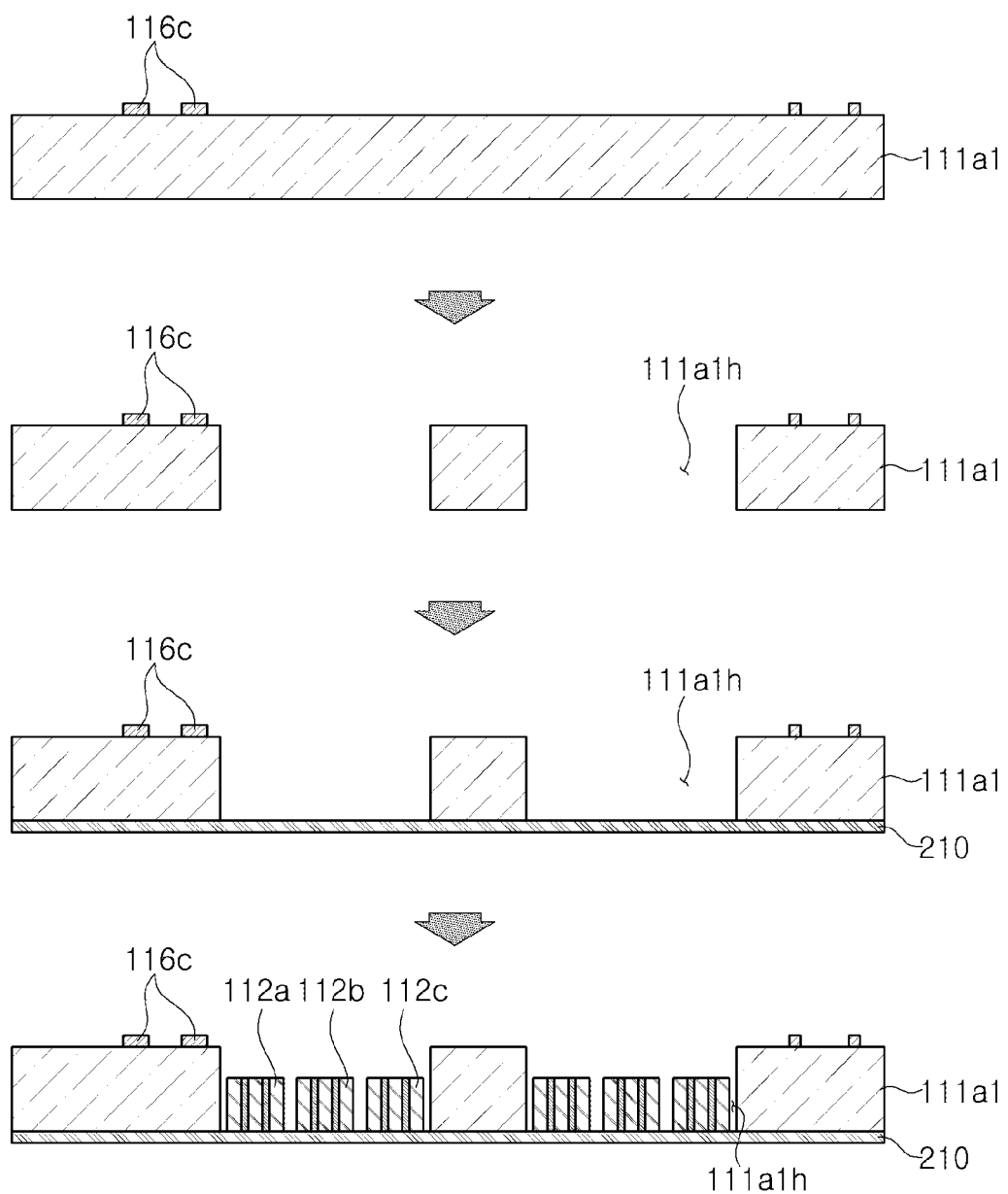
FIGS. 4 through 9 are schematic views illustrating an example of processes of manufacturing the board with an embedded passive component of FIG. 3.

Referring to FIG. 4, a copper clad laminate or the like as a first core layer 111a may be first prepared. In this case, a mark pattern 116c may be formed on at least one surface of the first core layer 111a. Then, one or more through-holes 111a1h may be formed in the first core layer 111a using a laser drill, a mechanical drill, or the like. Next, a tape 210 may be attached to one side of the first core layer 111a, and one or more passive components 112a, 112b, and 112c may be disposed in each of one or more through-holes 111a1h of the first core layer 111a by using the tape 210.

Figure 5:
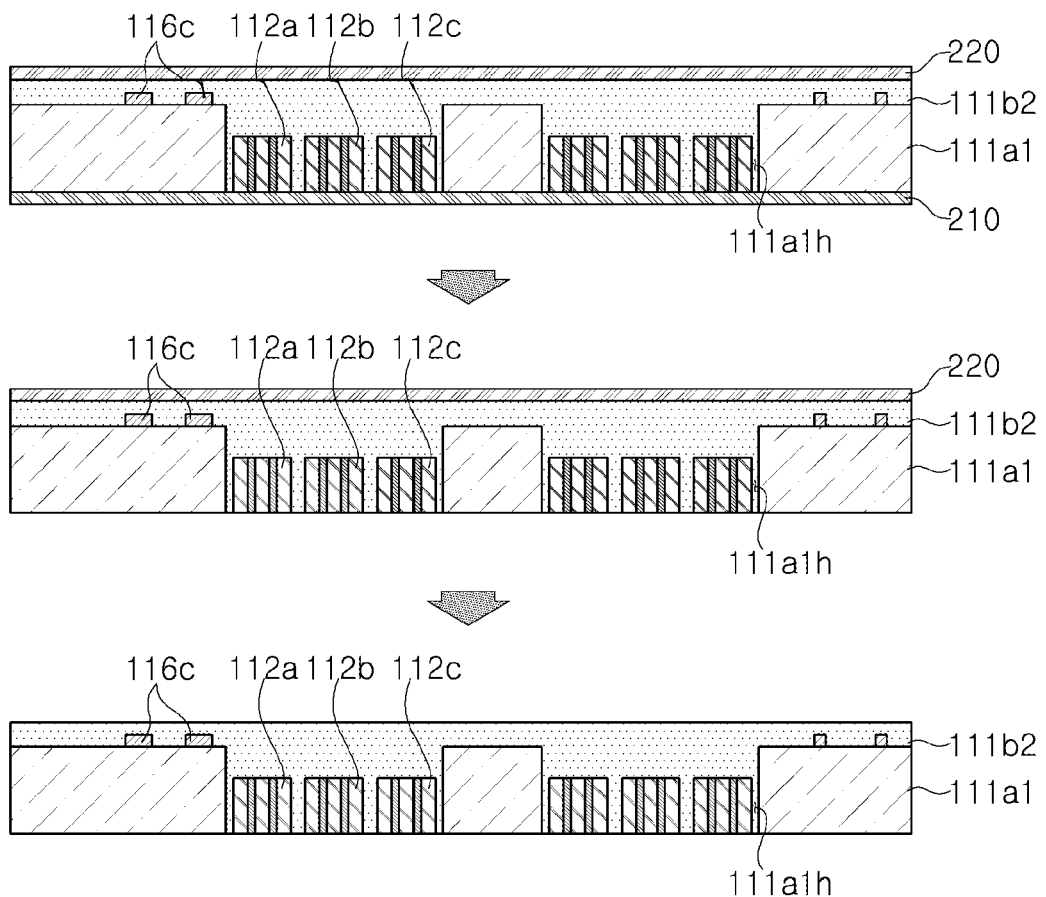

Referring to FIG. 5, a second insulating layer 111b2 may be laminated on the tape 210 by using a copper foil 220 to cover the first core layer 111a1 and the passive components 112a, 112b, and 112c and fill at least a portion of each of the through-holes 111a1h, and then may be cured. Then, the tape 210 may be peeled off. After the tape 210 is peeled off, one surface of the first core layer 111a1, one surface of the second insulating layer 111b2, and one surface of each of the passive components 112a, 112b, and 112c are coplanar with one another. Then, the copper foil 220 may be removed by etching.

Figure 6:
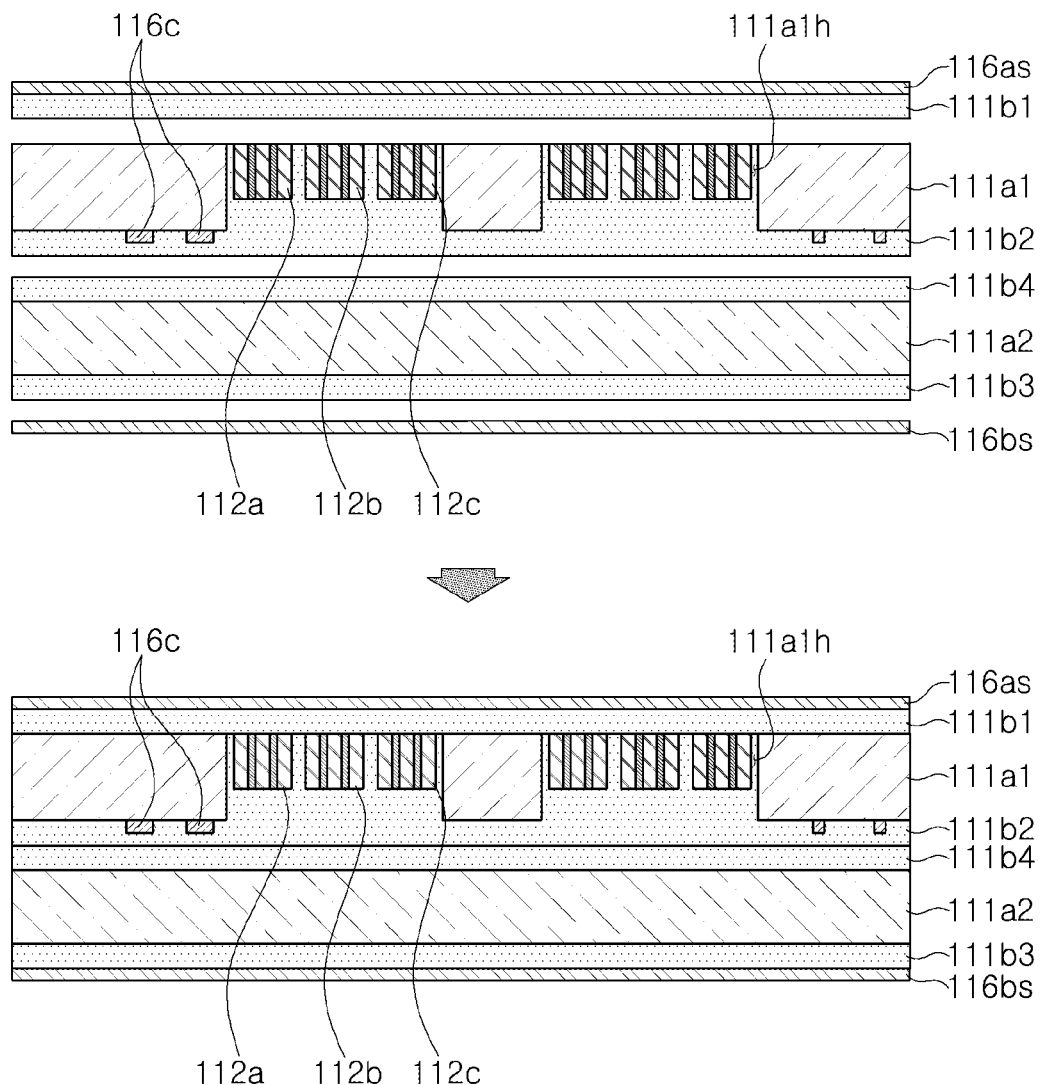

Then, referring to FIG. 6, a first copper foil 116as and a first insulating layer 111b1 may be stacked so that the passive components 112a, 112b, and 112c are embedded, the first core layer 111a1 covered with the second insulating layer 111b2, a fourth insulating layer 111b4, a second core layer 111a2, a third insulating layer 111b3, and a second copper foil 116bs may be collectively stacked in this order, thereby forming a basic structure of the core structure 110A described above. The first insulating layer 111b1, the third insulating layer 111b3, and the fourth insulating layer 111b4 may be introduced by using prepreg in an uncured state, and the second core layer 111a2 may be introduced by using an unclad CCL.

Figure 7:
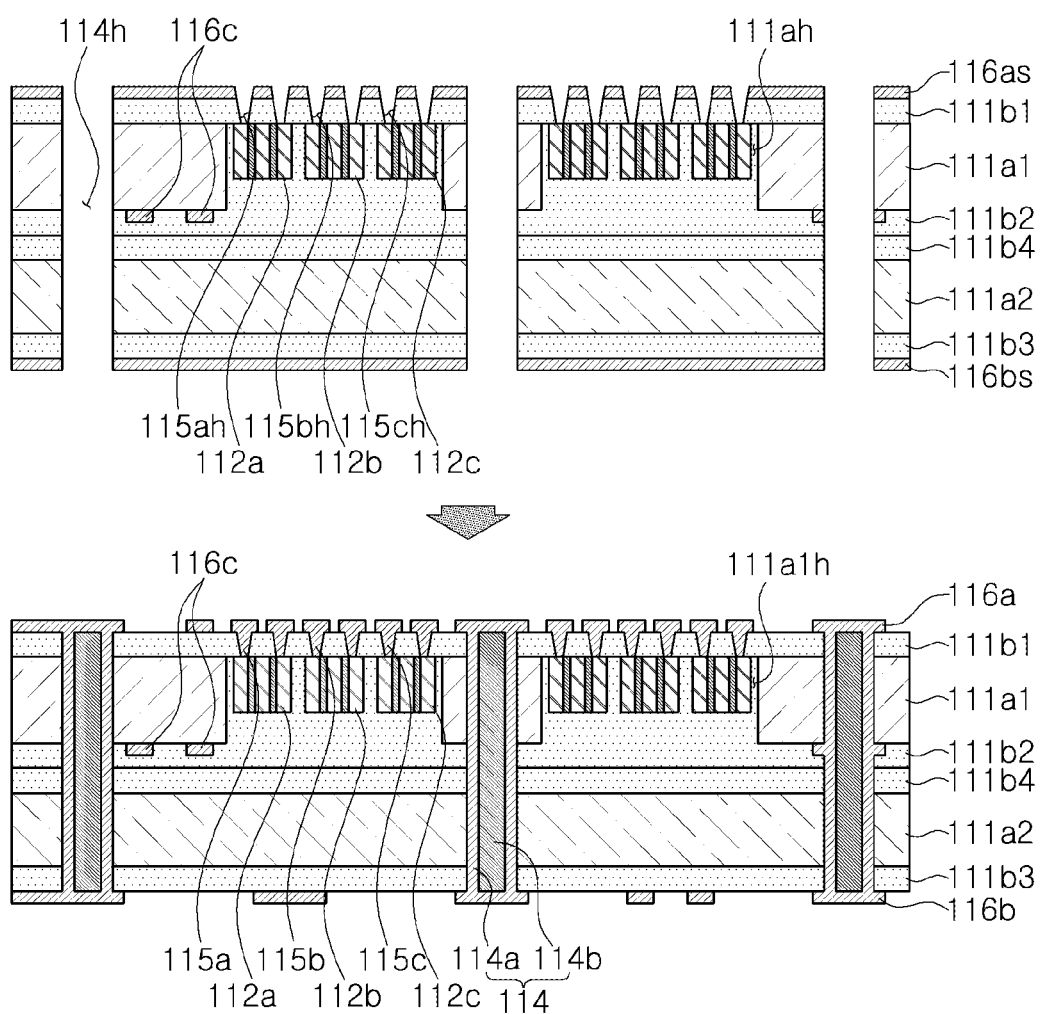

Then, referring to FIG. 7, a through-via hole 114h penetrating through the prepared basic structure of the core structure 110A may be formed by using a mechanical drill, laser drill, or the like. In addition, via holes 115ah, 115bh, and 115ch penetrating through the first insulating layer 111b1 and exposing respective electrodes of the passive components 112a, 112b, and 112c may be formed. Then, a through-via 114, connection vias 115a, 115b, and 115c, and first and second core wiring layers 116a and 116b may be formed by using the first and second copper foils 116as and 116bs as seed layers through plating, plugging, or the like. The core structure 110A may be formed through a series of processes.

Figure 8:
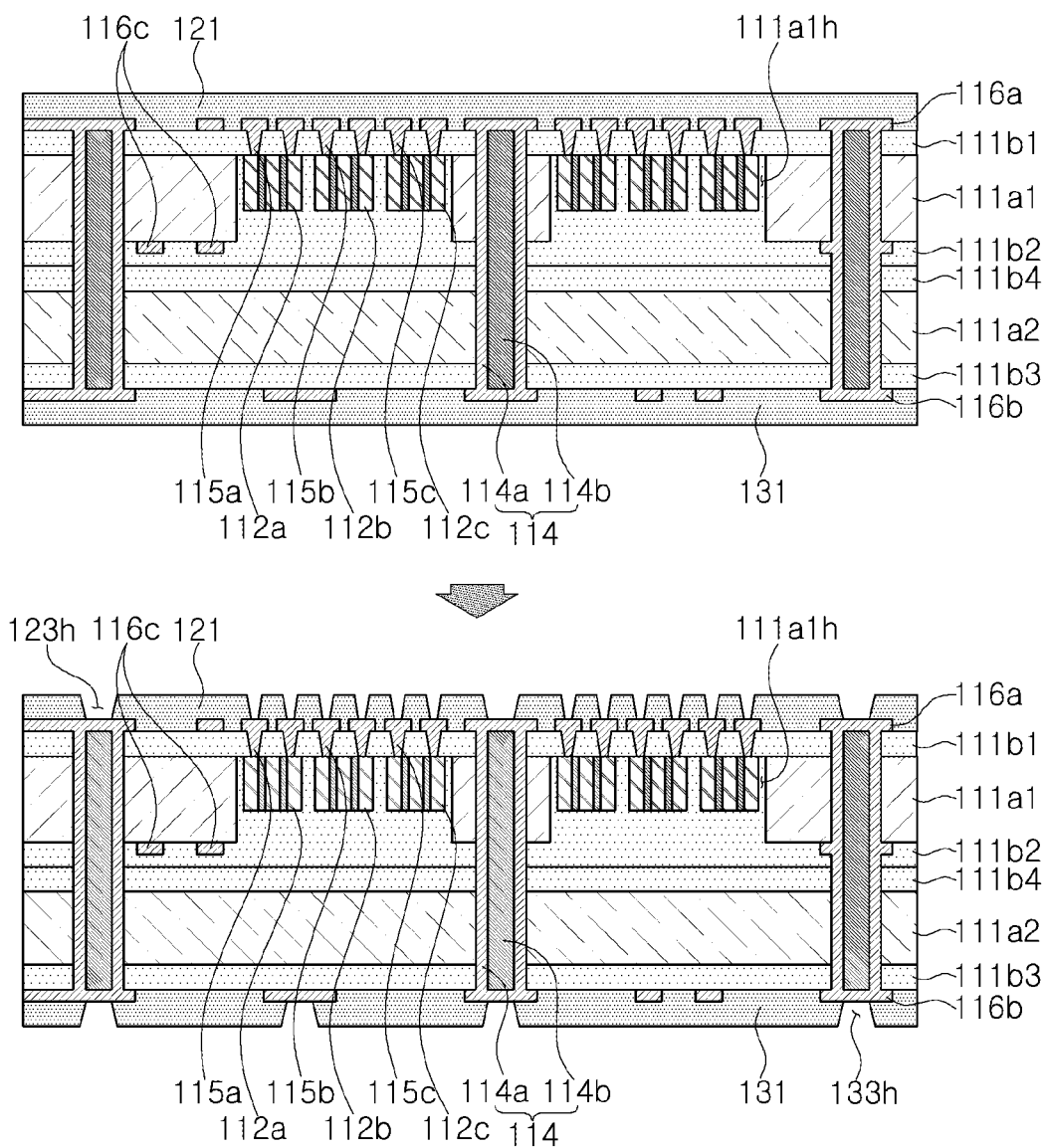

Then, referring to FIG. 8, first and second build-up layers 121 and 131 are formed on opposite sides of the core structure 110A, respectively. The first and second build-up layers 121 and 131 may be formed by laminating and then curing an ABF or the like. Then, via holes 123h and 133h may be formed in the first and second build-up layers 121 and 131, respectively, by using a laser drill, a mechanical drill, or the like. Then, first and second wiring via layers 123 and 133, and the first and second wiring layers 122 and 132 may be formed by plating or the like.

Figure 9:
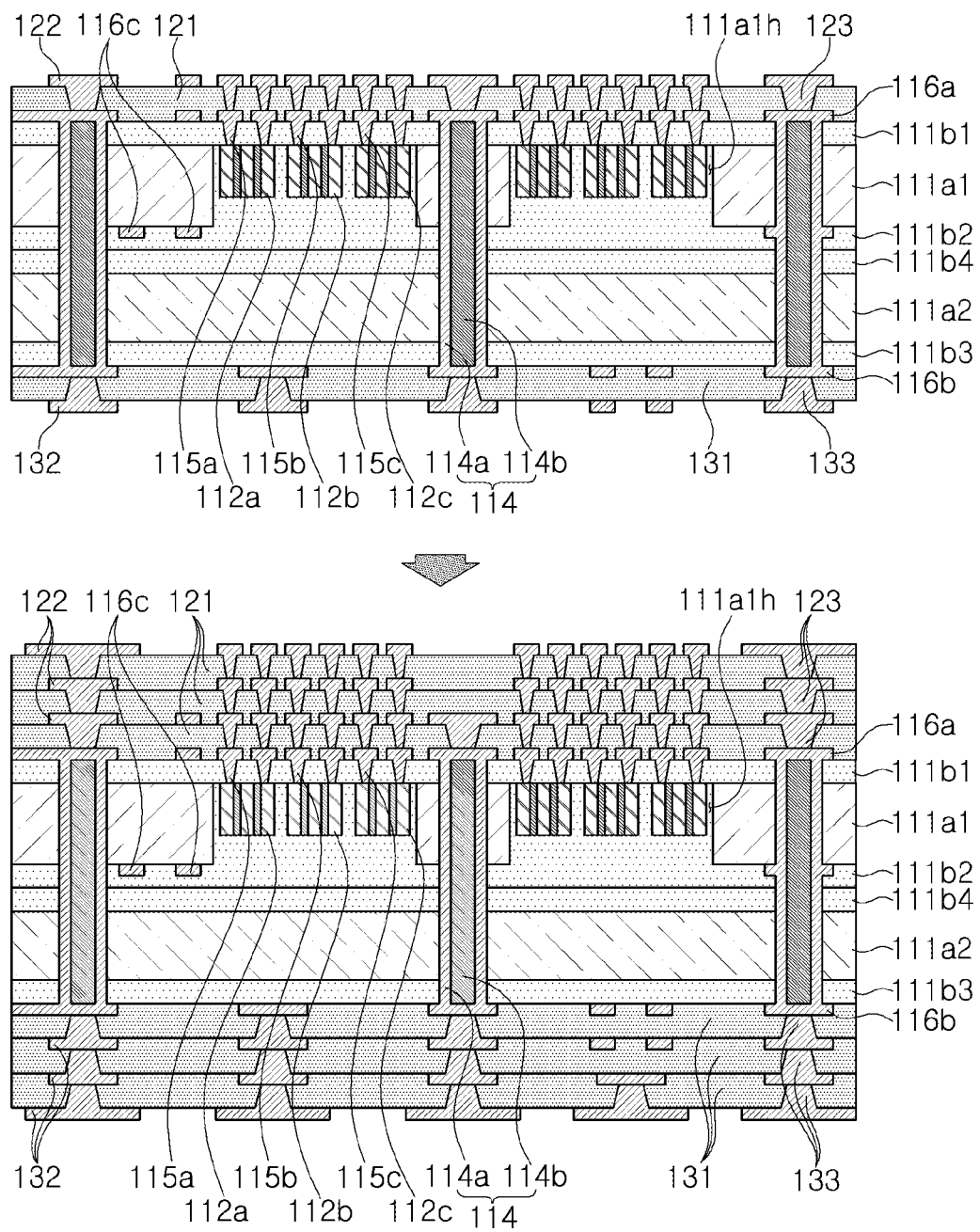

Then, referring to FIG. 9, the first and second build-up layers 121 and 131, the first and second wiring layers 122 and 132, and the first and second wiring via layers 123 and 133 may be formed as many as required by repeating the series of processes described above. Then, similarly, first and second passivation layers 124 and 134 may be formed by laminating and then curing an ABF or the like as needed, thereby forming first and second build-up structures 120 and 130. In addition, first and second electrical connection metals 140 and 150 may be formed and then a reflow process may be performed, thereby obtaining the board 100A with an embedded passive component according to the example described above.

Figure 10:
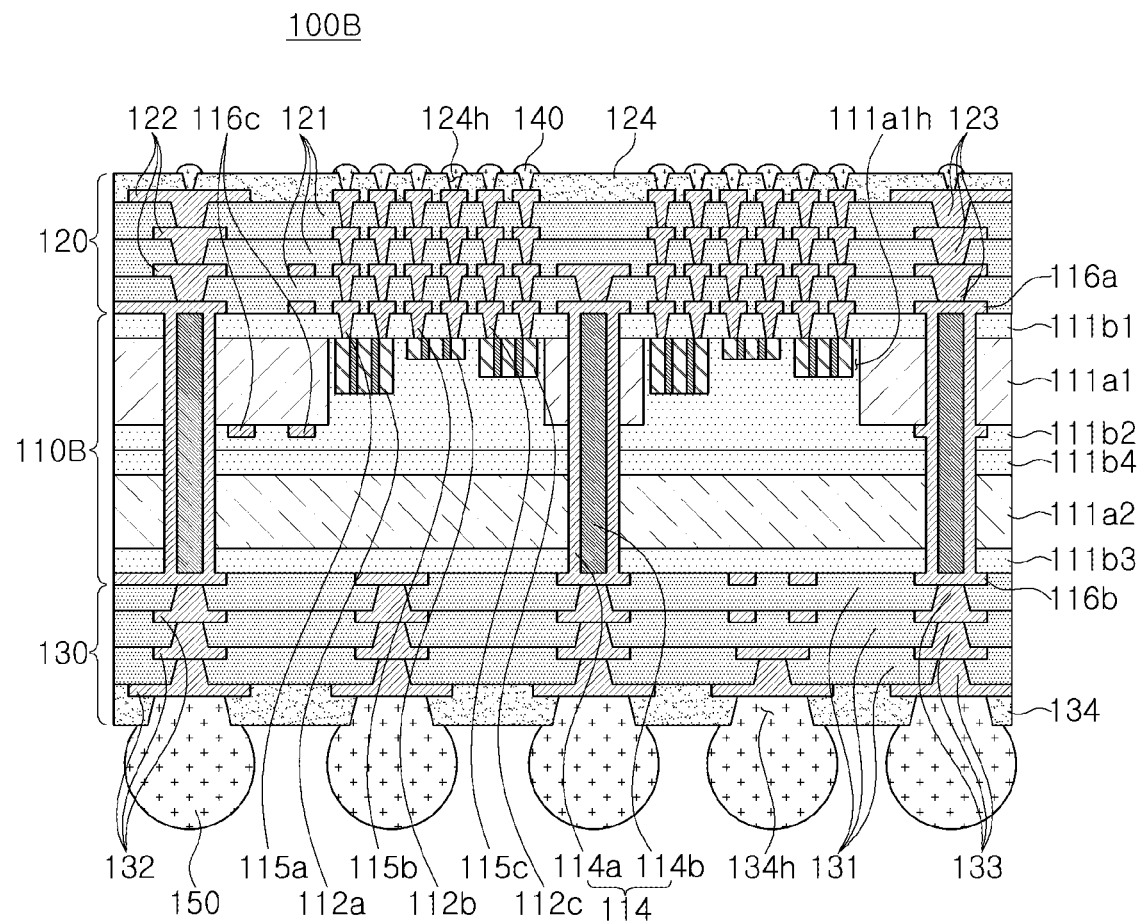
FIG. 10 is a schematic cross-sectional view illustrating another example of a board with an embedded passive component.

FIG. 10 is a schematic cross-sectional view illustrating another example of a board with an embedded passive component.

Referring to FIG. 10, in a board 100B with an embedded passive component according to another example, passive components 112a, 112b, and 112c of which thicknesses are different from each other may be disposed and embedded in a through-hole 111a1h of a first core layer 111a1 of a core structure 110B, in comparison with the board 100A with an embedded passive component according to the example described above. As such, even in a case in which the thicknesses of the passive components 112a, 112b, and 112c are different from each other, one surfaces of the passive components 112a, 112b, and 112c each contacting the first insulating layer 111b1 may be coplanar with each other, and may be coplanar with one surfaces of the first core layer 111a1 and a second insulating layer 111b2 each contacting the first insulating layer 111b1. However, other surfaces of the passive components 112a, 112b, and 112c each covered with the second insulating layer 111b2 may be positioned on different levels. As such, even in a case in which the thicknesses of the passive components 112a, 112b, and 112c are different from each other, a flat surface may be provided without any difficulty, and thus more excellent quality in via processing and plating may be realized without defects such as a void or undulation in a process of forming the first insulating layer 111b1, connection vias 115a, 115b, and 115c, and a first core wiring layer 116a. A description of other configurations overlaps those described above with reference to FIGS. 3 through 10, and is thus omitted.

Figure 11:
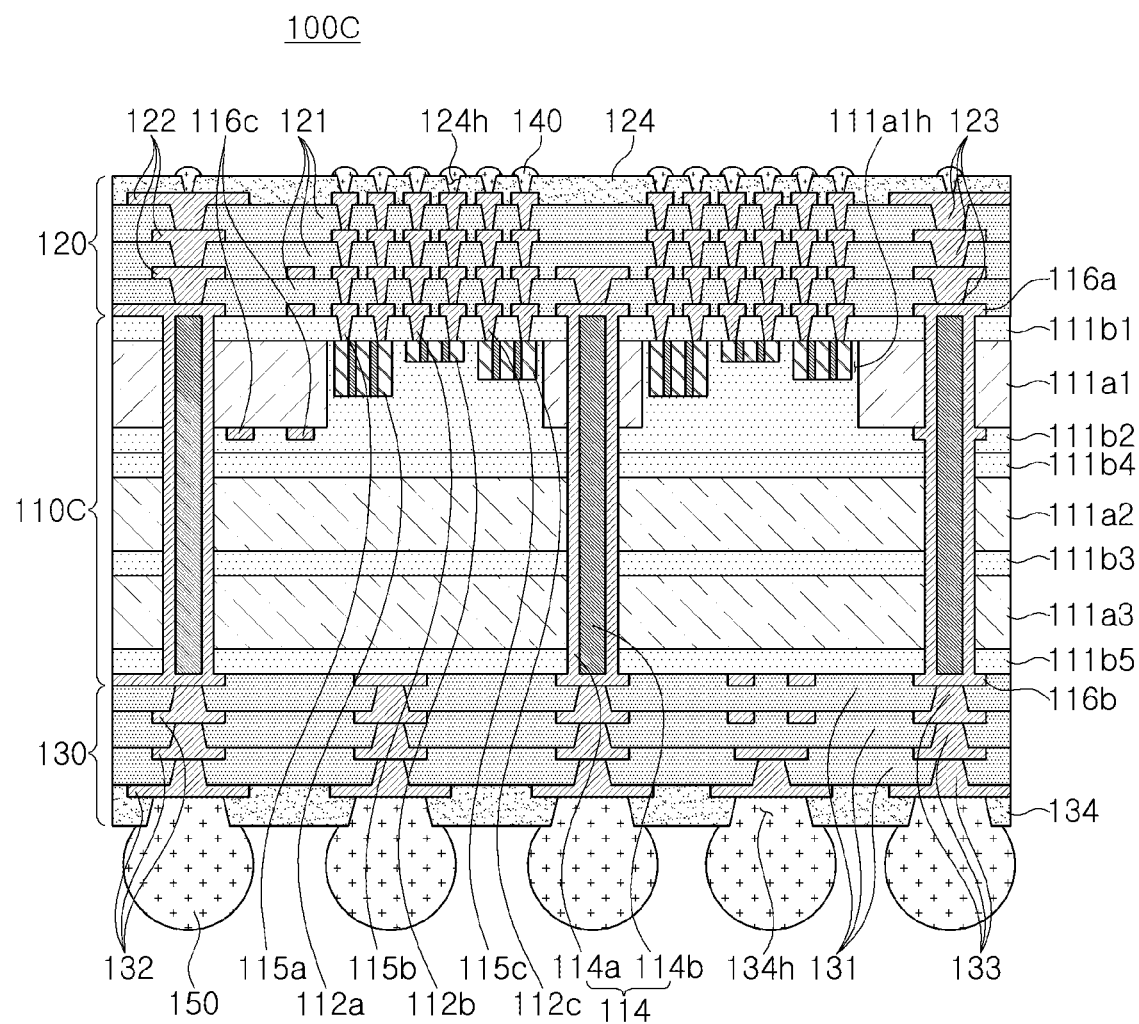
FIG. 11 is a schematic cross-sectional view illustrating another example of a board with an embedded passive component.

FIG. 11 is a schematic cross-sectional view illustrating another example of a board with an embedded passive component.

Referring to FIG. 11, in a board 100C with an embedded passive component according to another example, a core structure 110C may further include a third core layer 111a3 disposed on a third insulating layer 111b3 and a fifth insulating layer 111b5 disposed on the third core layer 111a3, in comparison with the board 100A with an embedded passive component according to the example described above. That is, the third core layer 111a3 may be introduced by additionally attaching an unclad CCL or the like in order to increase a thickness of the core structure 110C. In this case, a thicker core structure 110C may be introduced. Meanwhile, the description of the board 100B with an embedded passive component according to another example may also be applied to the board 100C with an embedded passive component according to another example. A description of other configurations overlaps those described above with reference to FIGS. 3 through 10, and is thus omitted.

Figure 12:
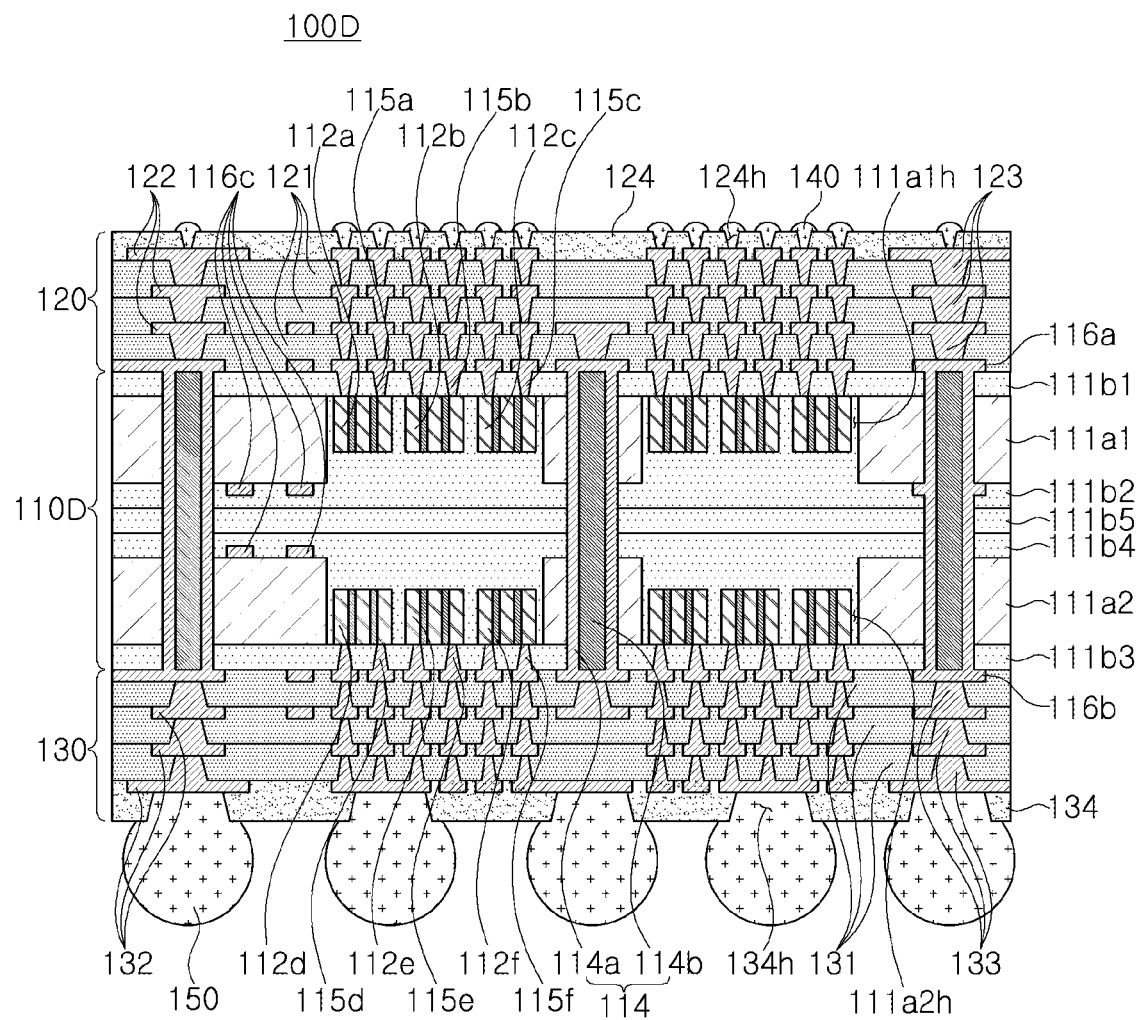
FIG. 12 is a schematic cross-sectional view illustrating another example of a board with an embedded passive component.

FIG. 12 is a schematic cross-sectional view illustrating another example of a board with an embedded passive component.

Referring to FIG. 12, in a board 100D with an embedded passive component according to another example, a second core layer 111a2 of a core structure 110D may include one or more through-holes 111a2h and one or more passive components 112d, 112e, and 112f are disposed in each of the one or more through-holes 111a2h, in comparison with the board 100A with an embedded passive component according to the example described above. In this case, in the core structure 110D, a fourth insulating layer 111b4 may be disposed between a second insulating layer 111b2 and the second core layer 111a2 to cover the second core layer 111a2 and the passive components 112d, 112e, and 112f, respectively, and fill at least a portion of each of the second through-holes 111a2h. If necessary, a fifth insulating layer 111b5 may be additionally disposed between the second insulating layer 111b2 and the fourth insulating layer 111b4. In addition, the core structure 110D may further include connection vias 115d, 115e, and 115f each penetrating through a third insulating layer 111b3 and electrically connecting a second core wiring layer 116b and the passive components 112d, 112e, and 112f, respectively. Also, one surfaces of the passive components 112d, 112e, and 112f each contacting the third insulating layer 111b3 may be coplanar with each other, and may be coplanar with one surfaces of the second core layer 111a2 and the fourth insulating layer 111b4 each contacting the third insulating layer 111b3. The other surfaces of the passive components 112d, 112e, and 112f covered with the fourth insulating layer 111b4 may each be spaced part from a first core layer 111a1 by a predetermined distance. In addition, heights of the connection vias 115d, 115e, and 115f may be the same as each other. Accordingly, also in a process of forming the third insulating layer 111b3, the connection vias 115d, 115e, and 115f, and the second core wiring layer 116b, more excellent quality in via processing and plating may be realized without defects such as a void or undulation. The through-holes 111a2h formed in the second core layer 111a2 may each be a hole formed to continuously surround the passive components 112d, 112e, and 112f accommodated in each through-hole 111a2h when viewed in a plan view. In addition, the connection vias 115d, 115e, and 115f may have a tapered shape of which a tapering direction is opposite to that of each of the connection vias 115a, 115b, and 115c. Meanwhile, the description of the board 100B with an embedded passive component according to another example and the board 100C with an embedded passive component according to another example may also be applied to the board 100D with an embedded passive component according to another example. A description of other configurations overlaps those described above with reference to FIGS. 3 through 11, and is thus omitted.

Figure 13:
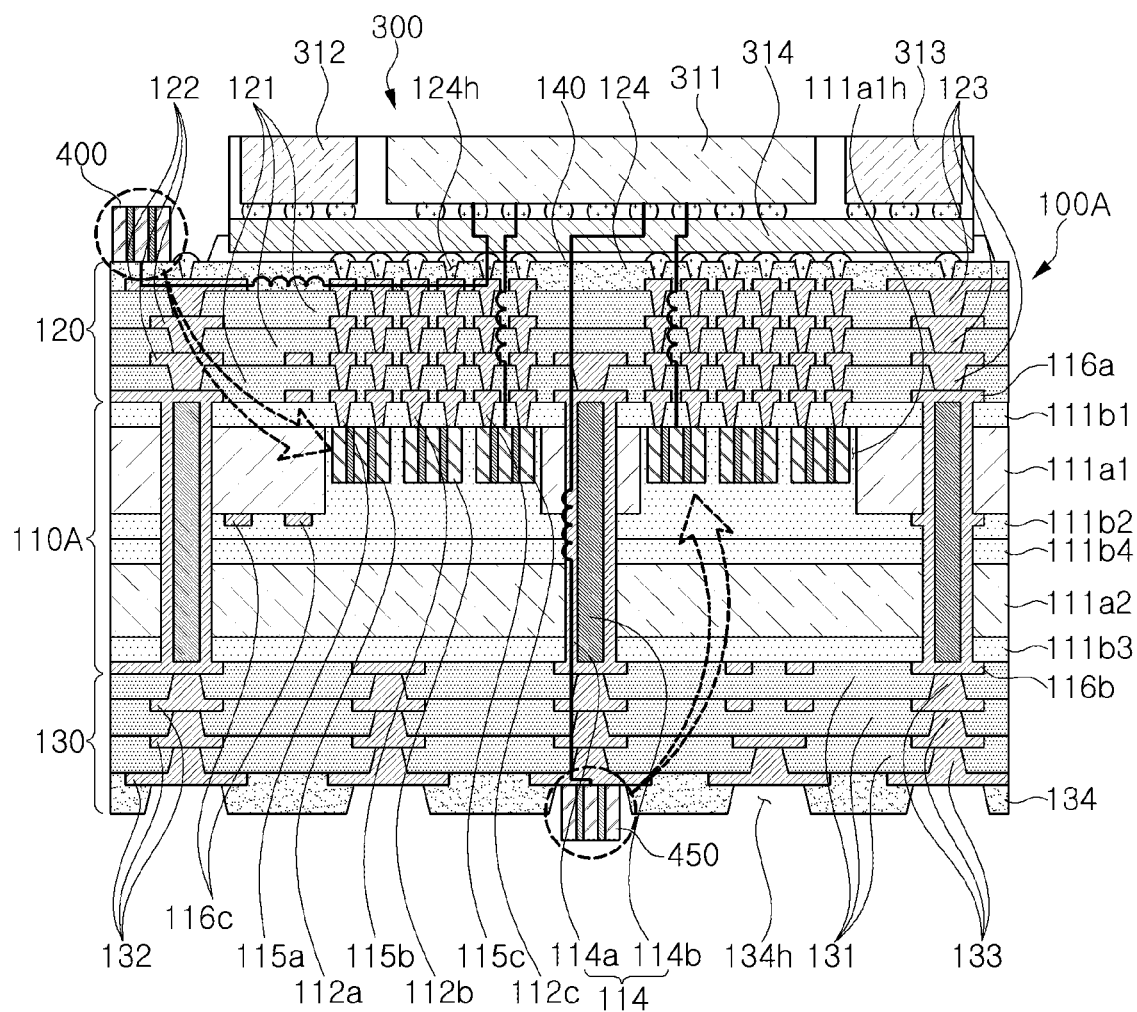
FIG. 13 is a schematic cross-sectional view illustrating an example of a case in which a semiconductor package is mounted on a board with an embedded passive component.

FIG. 13 is a schematic cross-sectional view illustrating an example of a case in which a semiconductor package is mounted on a board with an embedded passive component.

Referring to FIG. 13, in a case in which the board 100A with an embedded passive component according to the example is used as a BGA board, a semiconductor package 300 in which first to third semiconductor chips 311, 312, and 313 are mounted on an interposer 314 and electrically connected to each other may be mounted on the board 100A with an embedded passive component. Here, a DSC 400 and an LSC 450 disposed on the BGA board according to the related art may be embedded as the passive components 112a, 112b, and 112c in the board 100A with an embedded passive component, instead, to be electrically connected to the first to third semiconductor chips 311, 312, and 313 of the semiconductor package 300 with a very short electrically path through the plurality of first wiring layers 122 or the like of the first build-up structure 120. Meanwhile, the first semiconductor chip 311 may be an application specific integrated circuit (ASIC), and the second and third semiconductor chips 312 and 313 may be high bandwidth memories (HBM). However, the first to third semiconductor chips 311, 312, and 313 are not limited thereto. Meanwhile, the semiconductor package 300 may also be mounted on the board 100B with an embedded passive component, the board 100C with an embedded passive component, and the board 100D with an embedded passive component according to other examples in substantially the same manner.

Figure 14:
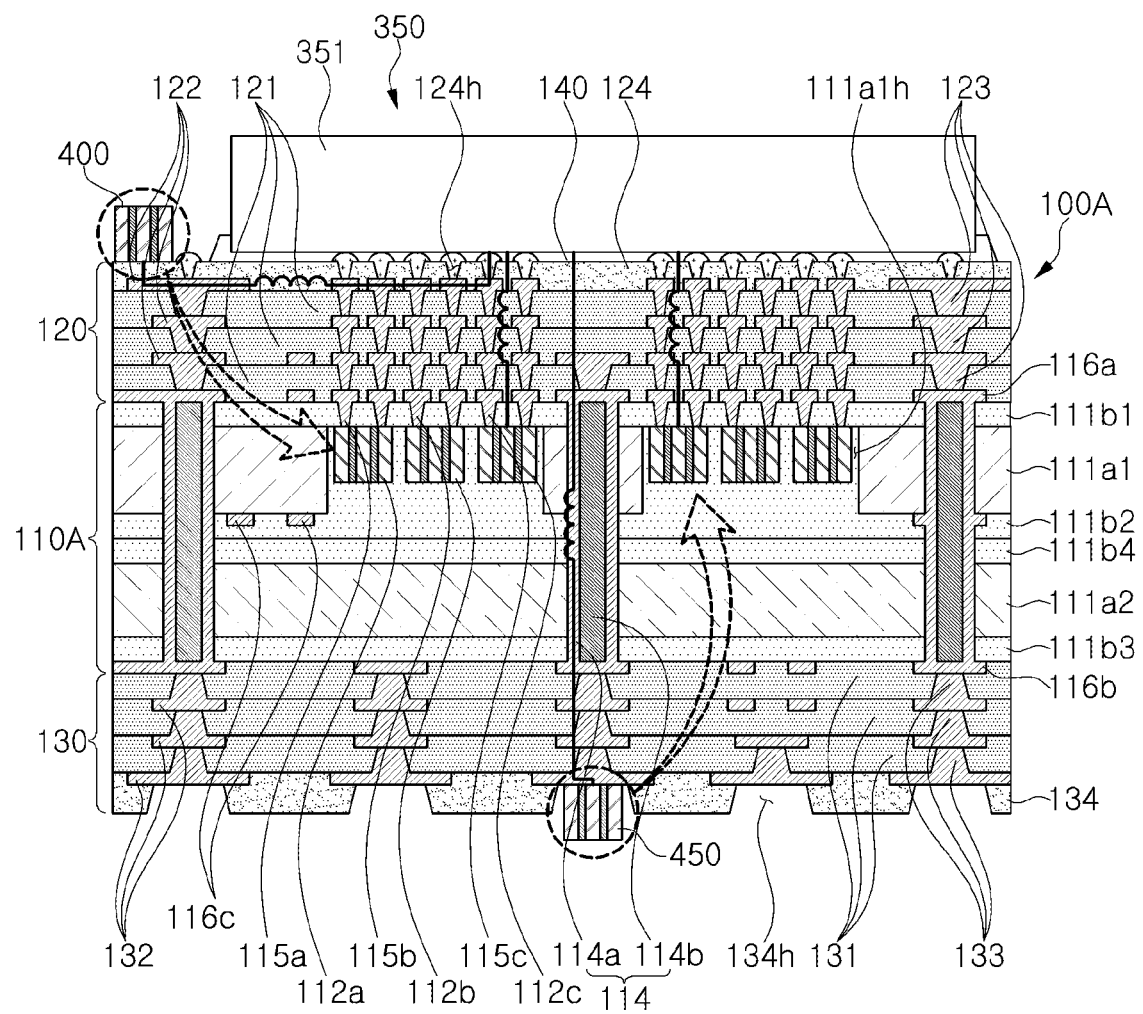
FIG. 14 is a schematic cross-sectional view illustrating an example of a case in which a semiconductor chip is mounted on a board with an embedded passive component.

FIG. 14 is a schematic cross-sectional view illustrating an example of a case in which a semiconductor chip is mounted on a board with an embedded passive component.

Referring to FIG. 14, in a case in which the board 100A with an embedded passive component according to the example is used as a BGA board, a packaged semiconductor chip 350 may be mounted on the board 100A with an embedded passive component. Here, the DSC 400 and the LSC 450 disposed on the BGA board according to the related art may be embedded as the passive components 112a, 112b, and 112c in the board 100A with an embedded passive component, instead, to be electrically connected to a semiconductor chip 351 in the packaged semiconductor chip 350 with a very short electrically path through the plurality of first wiring layers 122 or the like of the first build-up structure 120. Meanwhile, the semiconductor chip 351 may be a central processing unit (CPU), but is not limited thereto. Meanwhile, the packaged semiconductor chip 350 may also be mounted on the board 100B with an embedded passive component, the board 100C with an embedded passive component, and the board 100D with an embedded passive component according to other examples in substantially the same manner.

Figure 15:
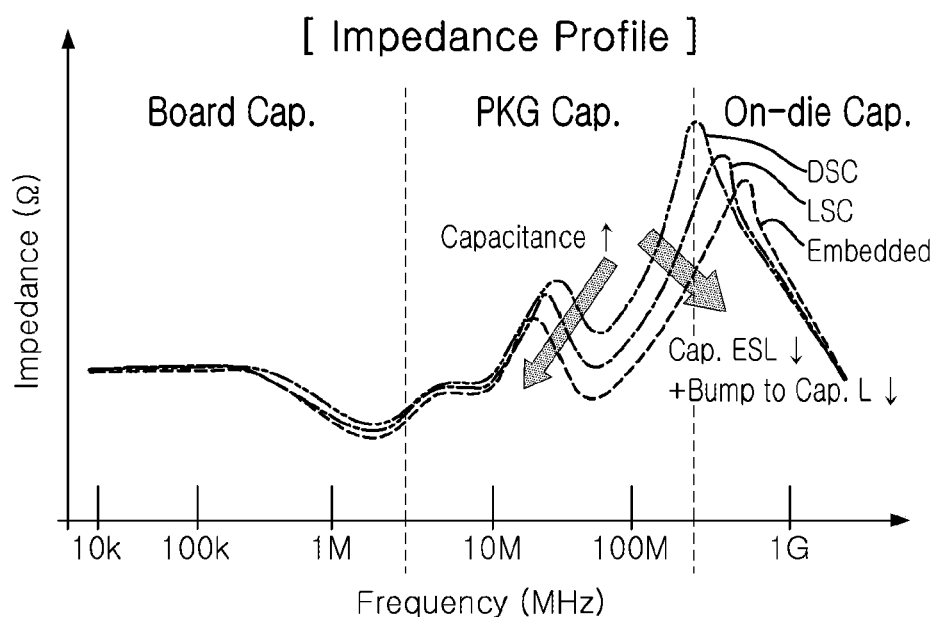
FIG. 15 schematically shows an effect of a board with an embedded passive component.

FIG. 15 schematically shows an effect of a board with an embedded passive component.

Referring to FIG. 15, in a case in which the board 100A with an embedded passive component, the board 100B with an embedded passive component, the board 100C with an embedded passive component, or the board 100D with an embedded passive component is used, instead of the BGA board according to the related art, as illustrated in FIG. 13 or 14, the passive components 112a, 112b, and 112c are embedded in the board 100A with an embedded passive component, the board 100B with an embedded passive component, the board 100C with an embedded passive component, or the board 100D with an embedded passive component to be electrically connected to the semiconductor chip with a very short electrical path. Therefore, a distance between the chip and the capacitor may be decreased in comparison to a case of using the DSC and the LSC, such that parasitic inductance and impedance of the board may be effectively reduced. As a result, a power integrity characteristic may be effectively improved.

As set forth above, according to the exemplary embodiment in the present disclosure, a board with an embedded passive component, which may improve power integrity by significantly decreasing a distance between a semiconductor chip and a passive component to reduce parasitic inductance and impedance of the board, may improve reliability by significantly reducing defects such as a void or undulation, and, particularly, may have excellent quality in via processing and plating even in a case in which thicknesses of passive components are different from each other when a plurality of passive components are embedded, may be provided.

In the present disclosure, the term "coplanar" herein, which means that components are positioned on substantially the same levels, is a concept including not only a case in which the components are positioned on exactly the same level, but also a case in which the components are positioned on slightly different levels due to an error in a process. Further, the phrase "the same height" herein is a concept including not only a case in which heights of components are exactly the same as each other, but also a case in which there is a slight difference between the heights of the components due to an error in a process. That is, the phrase "the same height" means that heights of components are substantially the same as each other.

Herein, for convenience, a lower side, a lower portion, a lower surface, and the like, are used to refer to a direction toward a mounted surface of the semiconductor package including an organic interposer in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

While exemplary embodiments have been shown and described above, it will be apparent to those skilled in the art that modifications and variations could be made without departing from the scope of the present invention as defined by the appended claims.

What is claimed is:

1. A board comprising:
a core structure including a first insulating layer, a first core layer disposed on the first insulating layer and including a first through-hole, one or more first passive components disposed in the first through-hole, a second insulating layer covering the one or more first passive components and filling at least a portion of the first through-hole, a second core layer disposed on the second insulating layer, and a third insulating layer disposed on the second core layer;
a first build-up structure disposed on one side of the core structure and including a plurality of first build-up layers and a plurality of first wiring layers; and
a second build-up structure disposed on the other side of the core structure and including a plurality of second build-up layers and a plurality of second wiring layers,
wherein one surface of the first core layer contacting the first insulating layer is coplanar with one surface of an electrode of each of the one or more first passive components contacting the first insulating layer, the other surface of each of the one or more first passive components covered with the second insulating layer is spaced apart from the second core layer, and the one or more first passive components are electrically connected to at least one of the plurality of first wiring layers and the plurality of second wiring layers.

2. The board of claim 1, wherein one surface of the second insulating layer contacting the first insulating layer is coplanar with one surface of each of the first core layer and the one or more first passive components contacting the first insulating layer.

3. The board of claim 2, wherein the first core layer has a thickness equal to or greater than that of each of the one or more first passive components.

4. The board of claim 1, wherein the one or more first passive components include a 1-1-th passive component and a 1-2-th passive component, and
one surface of the 1-1-th passive component contacting the first insulating layer and one surface of the 1-2-th passive component contacting the first insulating layer are coplanar with each other.

5. The board of claim 4, wherein the 1-1-th passive component and the 1-2-th passive component have different thicknesses from each other, and
the other surface of the 1-1-th passive component covered with the second insulating layer and the other surface of the 2-2-th passive component covered with the second insulating layer are positioned on different levels.

6. The board of claim 4, wherein the core structure further includes a first core wiring layer disposed on an opposite side of the first insulating layer from the first core layer, and a 1-1-th connection via and a 1-2-th connection via each penetrating through the first insulating layer and electrically connecting the first core wiring layer to the 1-1-th passive component and the 1-2-th passive component, respectively,
the first core wiring layer is electrically connected to the plurality of first wiring layers, and
the 1-1-th connection via and the 1-2-th connection via have the same height.

7. The board of claim 6, wherein the core structure further includes a second core wiring layer disposed on an opposite side of the third insulating layer from the second core layer, and a through-via penetrating through all of the first insulating layer, the first core layer, the second insulating layer, the second core layer, and the third insulating layer and electrically connecting the first core wiring layer and the second core wiring layer to each other, and
the second core wiring layer is electrically connected to the plurality of second wiring layers.

8. The board of claim 1, wherein the core structure further includes mark patterns disposed on the other surface of the first core layer covered with the second insulating layer, and
at least one of the mark patterns is electrically insulated from the plurality of first and second wiring layers.

9. The board of claim 1, wherein the first and second core layers each have a thickness greater than that of each of the first and second build-up layers.

10. The board of claim 9, wherein the first and second core layers each have an elastic modulus greater than that of each of the first and second build-up layers.

11. The board of claim 1, wherein the core structure further includes a third core layer disposed on the third insulating layer and a fourth insulating layer disposed on the third core layer.

12. The board of claim 1, wherein the second core layer includes a second through-hole, and
the board further comprises one or more second passive components disposed in the second through-hole.

13. The board of claim 1, further comprising a semiconductor package disposed on an opposite side of the first build-up structure from the core structure,
wherein the one or more first passive components are electrically connected to the semiconductor package through the plurality of first wiring layers.

14. The board of claim 1, further comprising a semiconductor chip disposed on an opposite side of the first build-up structure from the core structure,
wherein the one or more first passive components are electrically connected to the semiconductor chip through the plurality of first wiring layers.

15. The board of claim 1, further comprising a plurality of electrical connection metals disposed on an opposite side of the second build-up structure from the core structure,
wherein the one or more first passive components are electrically connected to at least one of the plurality of electrical connection metals through the plurality of first and second wiring layers.

16. The board of claim 1, wherein the first build-up structure includes first vias penetrating the plurality of first build-up layers and connected to the plurality of first wiring layers, respectively,
the second build-up structure includes second vias penetrating the plurality of second build-up layers and connected to the plurality of second wiring layers, respectively, and
the first vias and the second vias are tapered in opposite directions.

17. The board of claim 1, wherein wiring layers are not disposed on the other surface of the first core layer contacting the second insulating layer.

18. The board of claim 1, wherein the other surface of the first core layer contacting the second insulating layer is not coplanar with the other surface of the electrode of each of the one or more first passive components contacting the second insulating layer.

19. A board comprising:
a core structure including a first insulating layer, a first core layer disposed on the first insulating layer and including a first through-hole, one or more first passive components disposed in the first through-hole, a second insulating layer covering the one or more first passive components and filling at least a portion of the first through-hole, a second core layer disposed on the second insulating layer, and a third insulating layer disposed on the second core layer;
a first build-up structure disposed on one side of the core structure and including a plurality of first build-up layers and a plurality of first wiring layers; and
a second build-up structure disposed on the other side of the core structure and including a plurality of second build-up layers and a plurality of second wiring layers,
wherein one surface of the first core layer contacting the first insulating layer is coplanar with one surface of each of the one or more first passive components contacting the first insulating layer, the other surface of each of the one or more first passive components covered with the second insulating layer is spaced apart from the second core layer, and the one or more first passive components are electrically connected to at least one of the plurality of first wiring layers and the plurality of second wiring layers,
wherein the second core layer includes a second through-hole, and
the board further comprises one or more second passive components disposed in the second through-hole, and wherein the one or more second passive components include a 2-1-th passive component and a 2-2-th passive component, the core structure further includes a fourth insulating layer disposed between the second insulating layer and the second core layer to cover the one or more second passive components and fill at least a portion of the second through-hole, a second core wiring layer disposed on an opposite side of the third insulating layer from the second core layer, and a 2-1-th connection via and a 2-2-th connection via each penetrating through the third insulating layer and electrically connecting the second core wiring layer to the 2-1-th passive component and the 2-2-th passive component, respectively, the second core wiring layer is electrically connected to the plurality of second wiring layers, one surface of the 2-1-th passive component contacting the third insulating layer and one surface of the 2-2-th passive component contacting the third insulating layer are coplanar with one surface of the second core layer contacting the third insulating layer, the other surface of the 2-1-th passive component covered with the fourth insulating layer and the other surface of the 2-2-th passive component covered with the fourth insulating layer are each spaced apart from the first core layer, and the 2-1-th connection via and the 2-2-th connection via have the same height.

\* \* \* \* \*